(12) United States Patent
Chen et al.

(10) Patent No.: US 11,302,647 B2
(45) Date of Patent: Apr. 12, 2022

(54) SEMICONDUCTOR DEVICE PACKAGE INCLUDING CONDUCTIVE LAYERS AS SHIELDING AND METHOD OF MANUFACTURING THE SAME

(71) Applicant: Advanced Semiconductor Engineering, Inc., Kaohsiung (TW)

(72) Inventors: Ming-Hung Chen, Kaohsiung (TW); Hui-Ping Jian, Kaohsiung (TW); Wei-Zhen Qiu, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 0 days.

(21) Appl. No.: 16/874,524

(22) Filed: May 14, 2020

(65) Prior Publication Data
US 2021/0358859 A1   Nov. 18, 2021

(51) Int. Cl.
*H01L 23/552*   (2006.01)

(52) U.S. Cl.
CPC .................................. *H01L 23/552* (2013.01)

(58) Field of Classification Search
CPC .. H02J 7/025; H02J 50/10; H01F 1/00; H01L 21/486; H01L 23/645; H01L 23/49827; H01L 24/16; H01L 23/3114; H01L 25/0655; H01L 21/485; H01L 21/565; H01L 23/49838; H01L 23/5386; H01L 23/552; H01L 21/4817; H01L 23/49811; H01L 21/4853
USPC ........................................................ 257/659
See application file for complete search history.

(56) References Cited

U.S. PATENT DOCUMENTS

| | | | |
|---|---|---|---|
| 2014/0048913 A1* | 2/2014 | Park ................. | H01L 23/552 257/659 |
| 2017/0118877 A1* | 4/2017 | Kumbhat ............ | H01L 24/97 |
| 2017/0200682 A1* | 7/2017 | Lin .................... | H01L 24/97 |
| 2018/0374798 A1* | 12/2018 | Lee ................... | H01L 23/552 |
| 2019/0115305 A1* | 4/2019 | Lin .................... | H01L 23/5386 |
| 2019/0189565 A1* | 6/2019 | Chen ................. | H01L 21/565 |
| 2021/0193587 A1* | 6/2021 | Yada ................. | H01L 23/5226 |

* cited by examiner

*Primary Examiner* — Didarul A Mazumder
(74) *Attorney, Agent, or Firm* — Foley & Lardner LLP

(57) ABSTRACT

The present disclosure provides for a semiconductor device package and a method for manufacturing the same. The semiconductor device package includes a substrate, a conductive element and conductive layers. The substrate has a first surface, a second surface opposite to the first surface and a lateral surface extending between the first surface and the second surface. The conductive element is disposed on the first surface of the substrate. The conductive layers have a first portion on the conductive element and a second portion on the lateral surface of the substrate. A number of layers of the first portion of the conductive layers is different from a number of layers of the second portion of the conductive layers.

18 Claims, 14 Drawing Sheets

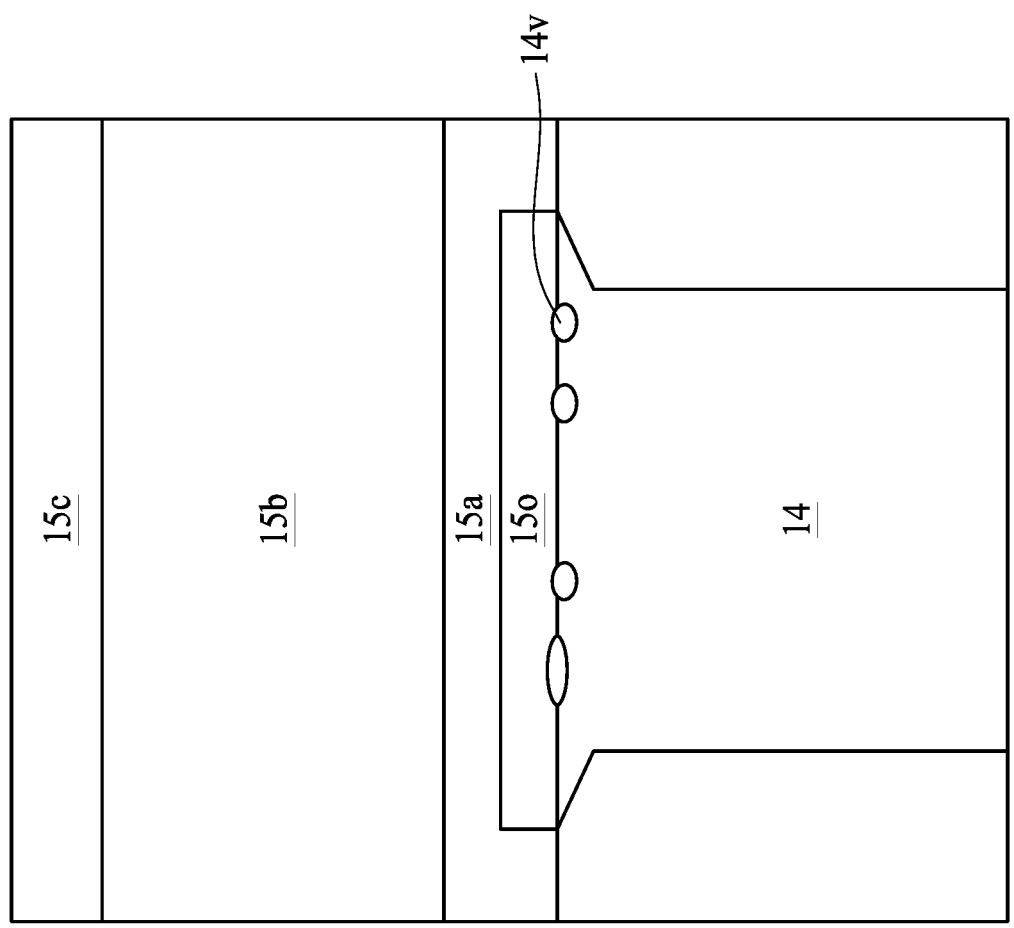

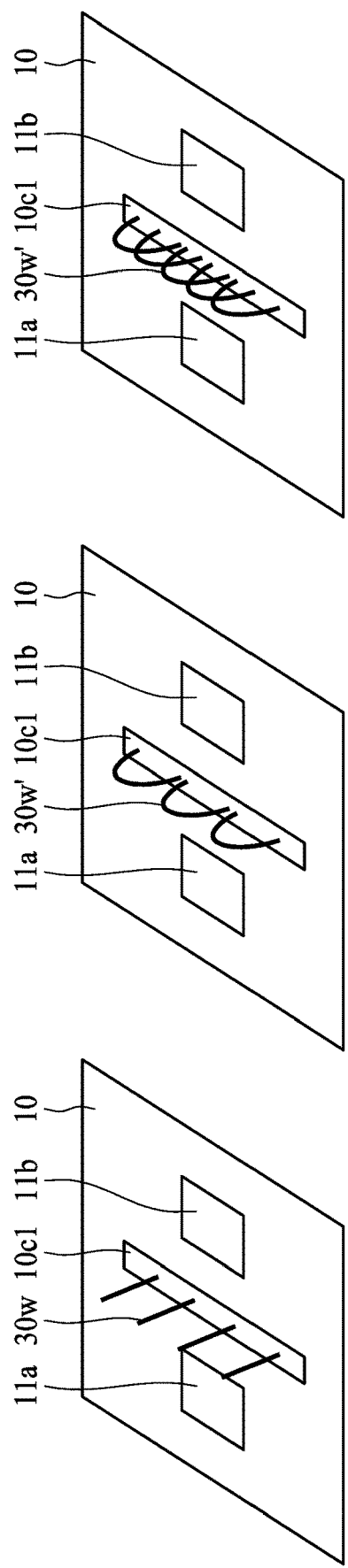

SEMICONDUCTOR DEVICE PACKAGE INCLUDING CONDUCTIVE LAYERS AS SHIELDING AND METHOD OF MANUFACTURING THE SAME

BACKGROUND

1. Technical Field

The present disclosure relates to a semiconductor device package and a method of manufacturing the same, and to a semiconductor device package including a conductive element and a manufacturing method thereof.

2. Description of the Related Art

Semiconductor devices have become progressively more complex, driven at least in part by the demand for enhanced processing speeds and smaller sizes. Enhanced processing speeds tend to involve higher clock speeds, which can involve more frequent transitions between signal levels, which, in turn, can lead to a higher level of electromagnetic emissions at higher frequencies or shorter wavelengths. Electromagnetic emissions can radiate from a source semiconductor device, and can be incident upon neighboring semiconductor devices. If the level of electromagnetic emissions at a neighboring semiconductor device is sufficiently high, these emissions can adversely affect the operation of the neighboring semiconductor device. This phenomenon is sometimes referred to as electromagnetic interference (EMI). Smaller sized semiconductor devices can exacerbate EMI by providing a higher density of semiconductor devices within an overall electronic system, and, thus, a higher level of undesired electromagnetic emissions at neighboring semiconductor devices. Hence, it is desirable to provide an EMI shielding between two electronic components.

SUMMARY

In one or more embodiments of the present disclosure, a semiconductor device package includes a substrate, a conductive element and conductive layers. The substrate has a first surface, a second surface opposite to the first surface and a lateral surface extending between the first surface and the second surface. The conductive element is disposed on the first surface of the substrate. The conductive layers have a first portion on the conductive element and a second portion on the lateral surface of the substrate. A number of layers of the first portion of the conductive layers is different from a number of layers of the second portion of the conductive layers.

In one or more embodiments of the present disclosure, a semiconductor device package includes a substrate, a conductive element and conductive layers. The substrate has a first surface, a second surface opposite to the first surface and a lateral surface extending between the first surface and the second surface. The conductive element is disposed on the first surface of the substrate. The conductive layers are disposed on the conductive element and the lateral surface of the substrate. The conductive layers include an anti-oxidation protective layer disposed on the conductive element and spaced apart from the lateral surface of the substrate. A resistance between the second surface of the substrate and the conductive layers is in a range from about 0.008 Ohm to about 0.08 Ohm.

In one or more embodiments of the present disclosure, a method of manufacturing a semiconductor device package includes (a) forming a conductive element on a first surface of a substrate; (b) forming an anti-oxidation protective layer in contact with a top surface of the conductive element; (c) forming a first electronic component on a second surface of the substrate opposite to the first surface of the substrate; and (d) forming a conductive layer on the anti-oxidation protective layer.

BRIEF DESCRIPTION OF THE DRAWINGS

FIG. 1B illustrates an enlarged view of a portion of the semiconductor device package as shown in FIG. 1A, in accordance with some embodiments of the present disclosure.

Figure 1A:
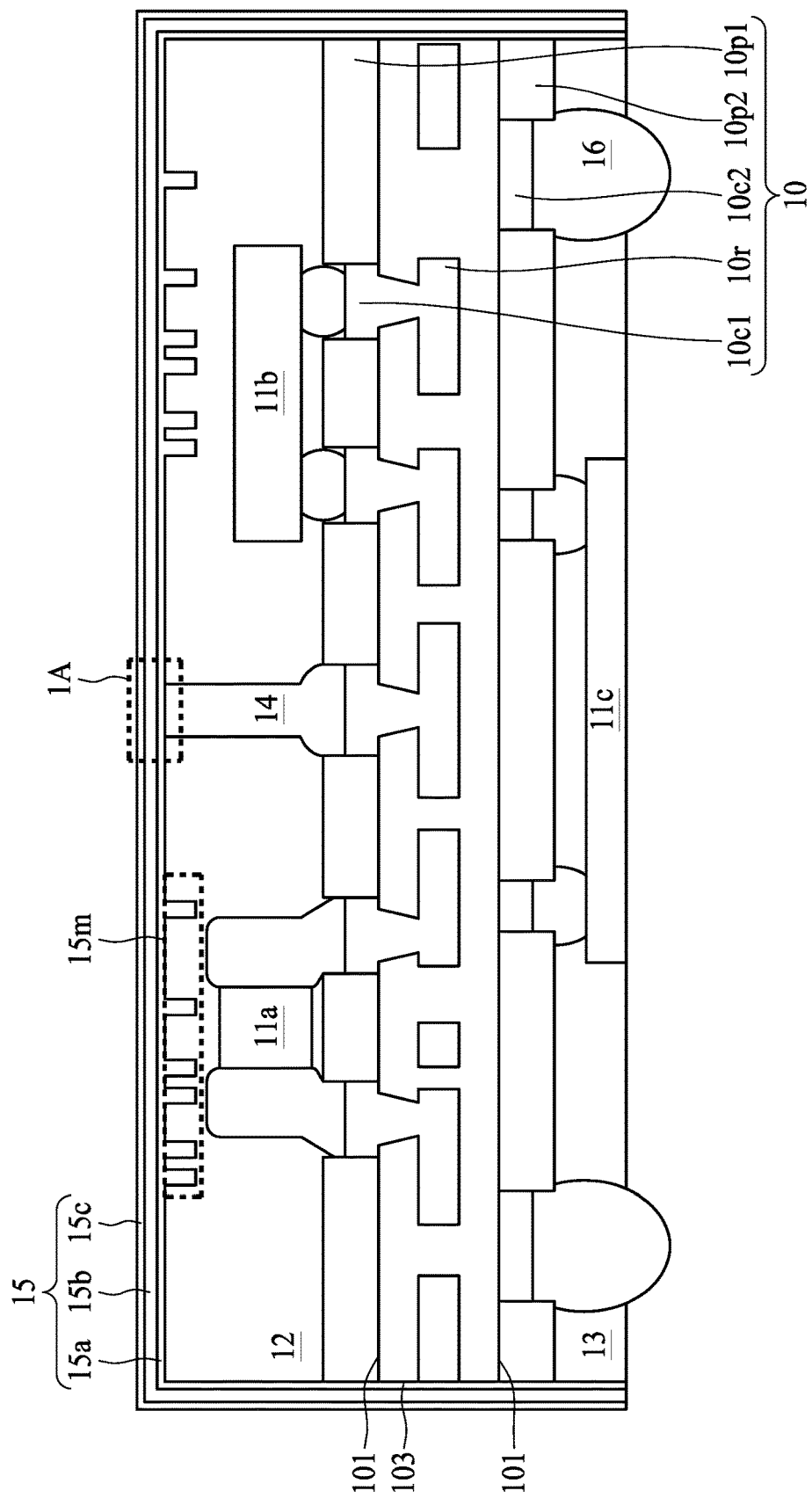
FIG. 1A illustrates a cross-sectional view of a semiconductor device package, in accordance with some embodiments of the present disclosure.

Common reference numerals are used throughout the drawings and the detailed description to indicate the same or similar components. The present disclosure will be readily understood from the following detailed description taken in conjunction with the accompanying drawings.

DETAILED DESCRIPTION

FIG. 1A illustrates a cross-sectional view of a semiconductor device package 1, in accordance with some embodiments of the present disclosure. The semiconductor device package 1 includes a substrate 10, electronic components 11a, 11b, 11c, package bodies 12, 13, a conductive element 14 (or shielding element), a cover 15, and electrical contacts 16.

The substrate 10 may be, for example, a printed circuit board, such as a paper-based copper foil laminate, a composite copper foil laminate, or a polymer-impregnated glass-fiber-based copper foil laminate. The substrate 10 may include an interconnection structure 10r, such as a redistribution layer (RDL) and/or a grounding element. The substrate 10 may have a surface 101, a surface 102 opposite to the surface 101, and a lateral surface 103 extending between the surface 101 and the surface 102.

The substrate 10 may include one or more conductive pads 10c1 in proximity to, adjacent to, or embedded in and exposed at the surface 101 of the substrate 10. The substrate 10 may include a solder resist 10p1 (or solder mask or passivation layer) on the surface 101 of the substrate 10 to fully expose or to expose at least a portion of the conductive pads 10c1 for electrical connections. For example, the solder resist 10p1 may cover a portion of the conductive pads 10c1. The substrate 10 may include one or more conductive pads 10c2 in proximity to, adjacent to, or embedded in and exposed at the surface 102 of the substrate 10. The substrate 10 may include a solder resist 10p2 (or solder mask or passivation layer) on the surface 102 of the substrate 10 to fully expose or to expose at least a portion of the conductive pads 10c2 for electrical connections. For example, the solder resist 10p2 may cover a portion of the conductive pads 10c2.

The electronic components 11a and 11b are disposed on the surface 101 of the substrate 10. The electronic components 11a and 11b may be active components or passive components or a combination thereof. An active electronic component may be, for example, an integrated chip (IC) or a die. A passive electronic component may be, for example, a capacitor, a resistor or an inductor. The electronic components 11a and 11b may be electrically connected to the substrate 10 (e.g., to the conductive pads 10c1) by way of flip-chip or wire-bond techniques.

The conductive element 14 is disposed on the surface 101 of the substrate 10. The conductive element 14 is disposed between the electronic component 11a and the electronic component 11b. For example, the electronic component 11a and the electronic component 11b are separated from each other by the conductive element 14. In some embodiments, the conductive element 14 is a compartment shield. In some embodiments, the conductive element 14 may include a shielding wall. In some embodiments, the conductive element 14 may include a plurality of conductive pillars or conductive wires, separated from each other. For example, there is a gap or distance between two adjacent conductive pillars (or conducive wires). This can reduce the cost for manufacturing the conductive element 14 compared with the use of the shielding wall.

In some embodiments, the conductive element 14 may be connected to ground through a conductive pad disposed on, or constituting part of, the substrate 10, or through the cover 15. The conductive element 14 may include, for example, aluminum (Al), copper (Cu), chromium (Cr), tin (Sn), gold (Au), silver (Ag), nickel (Ni), stainless steel, another metal, a mixture or an alloy thereof, or other combination thereof.

The package body 12 is disposed on the surface 101 of the substrate 10 to cover or encapsulate the electronic components 11a, 11b. The package body 12 may further cover or encapsulate at least a portion of the conductive element 14. For example, the package body 12 may cover a lateral surface of the conductive element 14 and expose a top surface (or an upper portion) of the conductive element 14. In some embodiments, the package body 12 includes an epoxy resin having fillers, a molding compound (e.g., an epoxy molding compound or other molding compound), a polyimide, a phenolic compound or material, a material with a silicone dispersed therein, or a combination thereof.

The electronic component 11c is disposed on the surface 102 of the substrate 10. The electronic component 11c may be an active component or a passive component or a combination thereof. An active electronic component may be, for example, an integrated chip (IC) or a die. A passive electronic component may be, for example, a capacitor, a resistor or an inductor. The electronic component 11c may be electrically connected to the substrate 10 (e.g., to the conductive pads 10c2) by way of flip-chip or wire-bond techniques.

In some embodiments, in operation, the electronic component 11c may generate a large amount of heat. For example, the electronic component 11c may be or include a heat source. In some embodiments, exposing a backside surface of the electronic component 11c from the package body 13 can facilitate the heat dissipation for the electronic component 11c. In some embodiments, the semiconductor device package 1 may be electrically connected to a printed circuit board (e.g., a motherboard) through the electrical contacts 16, and a thermal interface material (TIM) can be connected between the backside surface of the electronic component 11c and the printed circuit board to provide a heat dissipation path for the electronic component 11c.

The electrical contacts 16 (e.g. solder balls) are disposed on the surface 102 of the substrate 10. The electrical contacts 16 are electrically connected to the conductive pads 10c2 of the substrate 10 to provide electrical connections between the semiconductor device package 1 and external components (e.g. external circuits or circuit boards). In some embodiments, the electrical contacts 16 may include a controlled collapse chip connection (C4) bump, a ball grid array (BGA) or a land grid array (LGA).

The package body 13 is disposed on the surface 102 of the substrate 10 to cover or encapsulate the electronic component 11c. The package body 13 may further cover or encapsulate at least a portion of the electrical contacts 16 and expose the other portion of the electrical contacts 16 for electrical connections. In some embodiments, a backside surface of the electronic component 11c may be exposed from the package body 13. In other embodiments, the backside surface of the electronic component 11c may be covered by the package body 13. In some embodiments, the package body 13 includes an epoxy resin having fillers, a molding compound (e.g., an epoxy molding compound or other molding compound), a polyimide, a phenolic compound or material, a material with a silicone dispersed therein, or a combination thereof.

The cover 15 is disposed on an external surface of the package body 12 and covers the electronic components 11a, 11b, the package body 12 and the conductive element 14. The cover 15 may further extend along the lateral surface 103 of the substrate 10 and the lateral surface of the package body 13. In some embodiments, the cover 15 contacts the top surface of the conductive element 14 that is exposed from the package body 12. In some embodiments, the cover 15 is a conformal shield (e.g. is conformal to at least a portion of the package body 12, such as a top surface of the package body 12). In some embodiments, the cover 15 may contact the grounding element exposed from the lateral surface 103 of the substrate 10. In some embodiments, the cover 15 be connected to ground through the conductive element 14.

The cover 15 may include one or more conductive layers (or conductive films). For example, as shown in FIG. 1A, the cover 15 includes multiple conductive layers 15a, 15b, 15c. The conductive layer 15b is disposed between the conductive layer 15a and the conductive layer 15c. For example, the conductive layer 15b is sandwiched by the conductive layer 15a and the conductive layer 15c. In some embodiments, the conductive layers 15a and 15c may include stainless steel. In some embodiments, the conductive layer 15b may include Al, Cu, Cr, Sn, Au, Ag, Ni, a mixture or an alloy thereof, or other combination thereof. In some embodiments, the conductive layer 15a may further extend within the package body 12 to define a marking 15m. In other embodiments, the marking 15m may be omitted. In some embodiments, the conductive layer 15a may be or include a seed layer or an adhesive layer. In some embodiments, the conductive layer 15c may be or include a protective layer.

Separately or together, the conductive element 14 and the cover 15 can reduce the effect of electromagnetic emissions (e.g., EMI or cross-talk). For example, the conductive element 14 and the cover 15 can block (at least in part) electromagnetic emissions generated outside the conductive element 14 and the cover 15 from being received by the electronic components 11a, 11b, block (at least in part) electromagnetic emissions emanating from within the semiconductor device package 1 from leaving the semiconductor device package 1, and/or block (at least in part) electromagnetic emissions transmitted between the electronic components 11a and 11b.

In some embodiments, the semiconductor device package 1 may be formed by operations that include the following operations: (i) forming elements (e.g., the electronic components 11a, 11b, the conductive element 14 and the package body 12) on the surface 101 of the substrate 10; (ii) forming elements (e.g., the electronic component 11c, the package body 13 and the electrical contacts 16) on the surface 102 of the substrate 10; and (iii) forming the cover 15 on the external surfaces of the package body 12, 13 and the substrate 10 to contact the top surface of the conductive element 14.

However, since the cover 15 is formed after the formation of the elements on the surface 102 of the substrate 10, the top surface of the conductive element 14 would be exposed to air for a while (e.g., at least during the time period between the formation of the elements on the surface 102 of the substrate 10 and the formation of the cover 15). Hence, as shown in FIG. 1B, which illustrates an enlarged view of a portion of the semiconductor device package 1 encircled by a dotted-line square 1A as shown in FIG. 1, a metallic oxide layer 15o (e.g., AgOx, CuOx or the like) is formed on or adjacent to the top surface of the conductive element 14. This would increase the resistance between the conductive element 14 and the cover 15 and adversely affect the shielding performance of the conductive element 14 and the cover 15. In addition, many voids 14v may be also formed within the conductive element 14 and/or the metallic oxide layer 15o. This would reduce the structural strength of the conductive element 14 and the cover 15, and adversely affect the electrical performance of the semiconductor device package 1.

In some embodiments, to prevent the oxidation of the top surface of the conductive element 14, the conductive element 14 may be formed of Au. However, this would increase the cost for manufacturing the conductive element 14. In some embodiments, the metallic oxide layer 15o may be removed or reduced by applying plasma (e.g., inductively coupled plasma, ICP), etching, grinding or polishing. However, this would increase the manufacturing cost and time and encounter the process feasibility. In some embodiments, a tape or glue may be attached to the top surface of the conductive element 14 before the formation of the elements on the surface 102 of the substrate 10 to prevent the oxidation of the top surface of the conductive element 14. However, when the tape or glue has to be removed to form the cover 15, some of the tape or glue may remain on the top surface of the conductive element 14 (i.e., the issue of glue residue), which would hinder the connection between the conductive element 14 and the cover 15.

Figure 2:
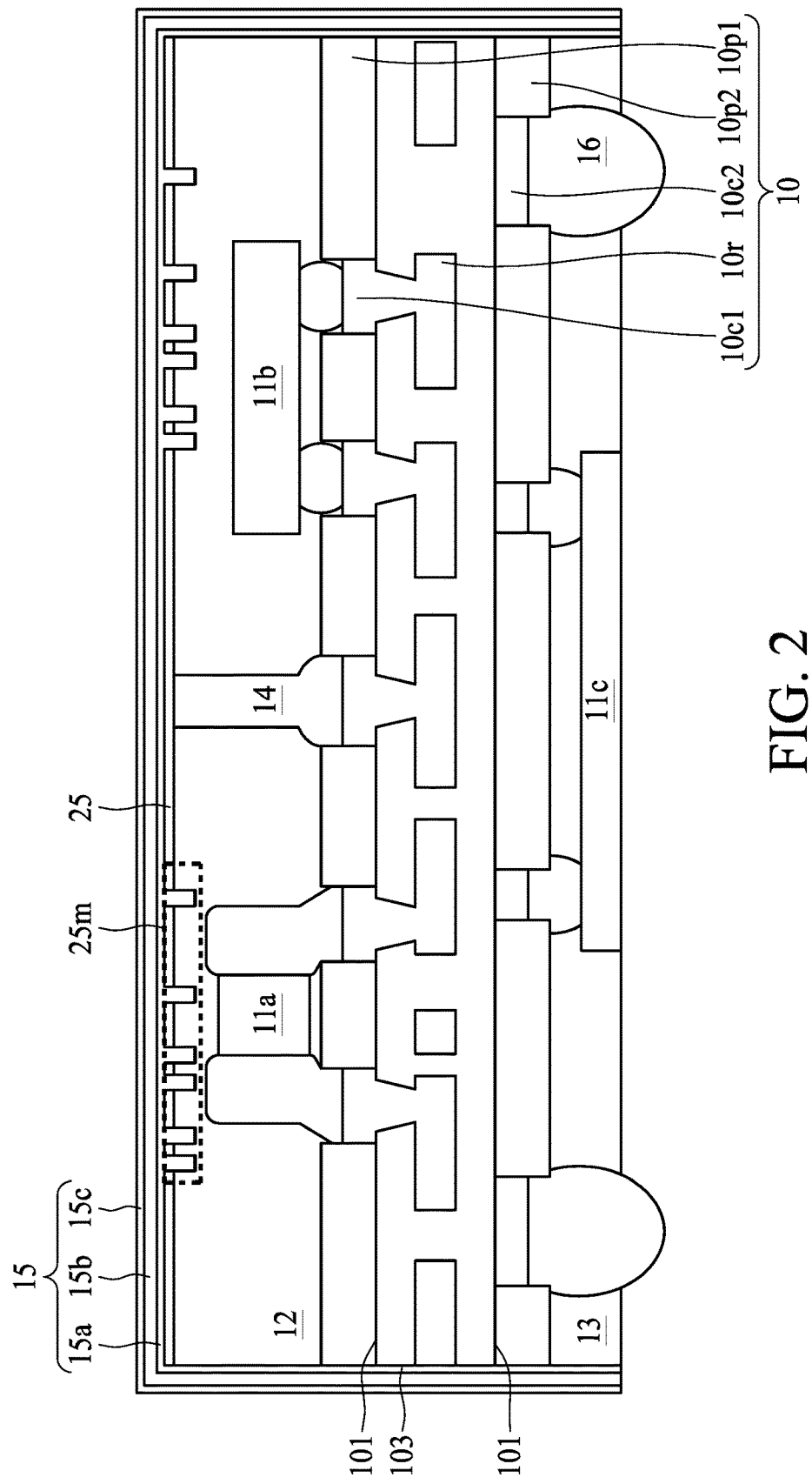
FIG. 2 illustrates a cross-sectional view of a semiconductor device package, in accordance with some embodiments of the present disclosure.

FIG. 2 illustrates a cross-sectional view of a semiconductor device package 2, in accordance with some embodiments of the present disclosure. The semiconductor device package 2 is similar to the semiconductor device package 1 as shown in FIG. 1, and some of the differences therebetween are described below.

The semiconductor device package 2 further includes a protection layer 25. The protection layer 25 is disposed on the package body 12. The protection layer 25 is disposed between the cover 15 and the package body 12. The protection layer 25 is disposed between the conductive layer 15a of the cover 15 and the package body 12. The protection layer 25 is in contact with the top surface of the package body 12. The protection layer 25 is in contact with the top surface of the conductive element 14. The protection layer 25 is in contact with the conductive layer 15a of the cover 15. In some embodiments, the protection layer 25 has a thickness equal to or greater than 0.1 micrometer. For example, the protection layer 25 may include a thickness of 0.3 micrometer.

In other embodiments, the protection layer 25 may be disposed on only the top surface of the conductive element 14. For example, the protection layer 25 is not disposed on the top surface of the package body 12. For example, the protection layer 25 is spaced apart from the package body 12. For example, the protection layer 25 is isolated from the package body 12. In this embodiment, the conductive layer 15a of the cover 15 may be in contact with the top surface of the package body 12.

In some embodiments, the protection layer 25 is disposed on the package body 12 without extending along the lateral surface of the package body 12, the lateral surface 103 of the substrate 10 and the lateral surface of the package body 13. For example, the protection layer 25 may include a lateral surface substantially coplanar with the lateral surface of the package body 12. For example, the conductive layer 15a may be in contact with the top surface and the lateral surface of the protection layer 25.

In some embodiments, the protection layer 25 may be or include an anti-oxidation protective layer to prevent the top surface of the conductive element 14 from being oxidized during the manufacturing processes (the detailed operations for manufacturing the semiconductor device package 2 would be described below). In some embodiments, the protection layer 25 and the conductive layer 15a of the cover 15 may include the same material. For example, the protection layer 25 may be a conductive layer including stainless steel. In other embodiments, the protection layer 25 and the conductive layer 15a of the cover 15 may include different materials. In some embodiments, the protection layer 25 and the conductive layer 15a of the cover 15 may be formed at different operations or steps during the manufacturing processes. Hence, there is a boundary or an interface between the protection layer 25 and the conductive layer 15a, even though the protection layer 25 and the conductive layer 15a of the cover 15 may include the same material.

In some embodiments, the protection layer 25 may function as the cover 15 to provide shielding performance. For example, the protection layer 25 may be regarded as a part of the cover 15. In some embodiments, as shown in FIG. 2, a number of the conductive layers of a portion of the cover 15 on the top surface of the package body 12 is different from a number of the conductive layers of the other portion of the cover 15 on the lateral surface of the package body 12, the lateral surface 103 of the substrate 10 and the lateral surface of the package body 13. For example, the cover 15 includes four conductive layers (i.e., the conductive layers 15a, 15b, 15c and the protection layer 25) on the top surface of the package body 12 (and the top surface of the conductive element 14) and three conductive layers (i.e., the conductive layers 15a, 15b, 15c) on the lateral surface of the package body 12, the lateral surface 103 of the substrate 10 and the lateral surface of the package body 13. For example, there are four conductive layers (i.e., the conductive layers 15a, 15b, 15c and the protection layer 25) on the top surface of the package body 12 (and the conductive element 14). For example, there are three conductive layers (i.e., the conductive layers 15a, 15b, 15c) on the lateral surface of the package body 12, the lateral surface 103 of the substrate 10 and the lateral surface of the package body 13.

In some embodiments, as shown in FIG. 2, the conductive layer 15a may further penetrate the protection layer 25 and extend within the package body 12 to define a marking 25m. For example, a portion of the conductive layer 15 extending toward the package body 12 may be covered by the protection layer 25 and the package body 12. In other embodiments, the marking 25m may be omitted.

In accordance with the embodiments as shown in FIG. 2, by forming the protection layer 25 to cover the top surface of the conductive element 14 (and the top surface of the package body 12), the metallic oxide layer on the top surface of the conductive element 14 may be eliminated or reduced. In some embodiments, compared with the conductive element 14 as shown in FIG. 1A, the thickness of the metallic oxide layer of the conductive element 14 as shown in FIG. 2 can be reduced at least by 90%. For example, the metallic oxide layer of the conductive element 14 as shown in FIG. 2 has a thickness at least 90% less than the thickness of the metallic oxide layer 15o of the conductive element 14 as shown in FIG. 1A.

In some embodiments, a resistance between the cover 15 and the conductive element 14 as shown in FIG. 2 is less than a resistance between the cover 15 and the conductive element 14 as shown in FIG. 1A. For example, a resistance between the cover 15 and the conductive pad 10c2 of the substrate 10 as shown in FIG. 2 is about 44% to about 77% less than a resistance between the cover 15 and the conductive pad 10c2 of the substrate 10 as shown in FIG. 1A. In some embodiments, the resistance between the cover 15 and the conductive pad 10c2 of the substrate 10 as shown in FIG. 2 is in a range from about 0.008 Ohm to about 0.08 Ohm. For example, the resistance between the cover 15 and the conductive pad 10c2 of the substrate 10 as shown in FIG. 2 is in a range from about 0.021 Ohm to about 0.08 Ohm. For example, the resistance between the cover 15 and the conductive pad 10c2 of the substrate 10 as shown in FIG. 2 is in a range from about 0.044 Ohm to about 0.08 Ohm. For example, the resistance between the cover 15 and the conductive pad 10c2 of the substrate 10 as shown in FIG. 2 is in a range from about 0.068 Ohm to about 0.08 Ohm.

Compared with the semiconductor device package 1 as shown in FIG. 1A, the metallic oxide layer of the conductive element 14 of the semiconductor device package 2 can be significantly reduced or even eliminated, and the resistance between the cover 15 and the conductive element 14 can be reduced as well. This would enhance the shielding performance of the conductive element 14 and the cover 15. In addition, the issue of voids can be eliminated or reduced as well, which would enhance the structural strength of the conductive element 14 and the cover 15 and the electrical performance of the semiconductor device package 2.

Figure 3A:
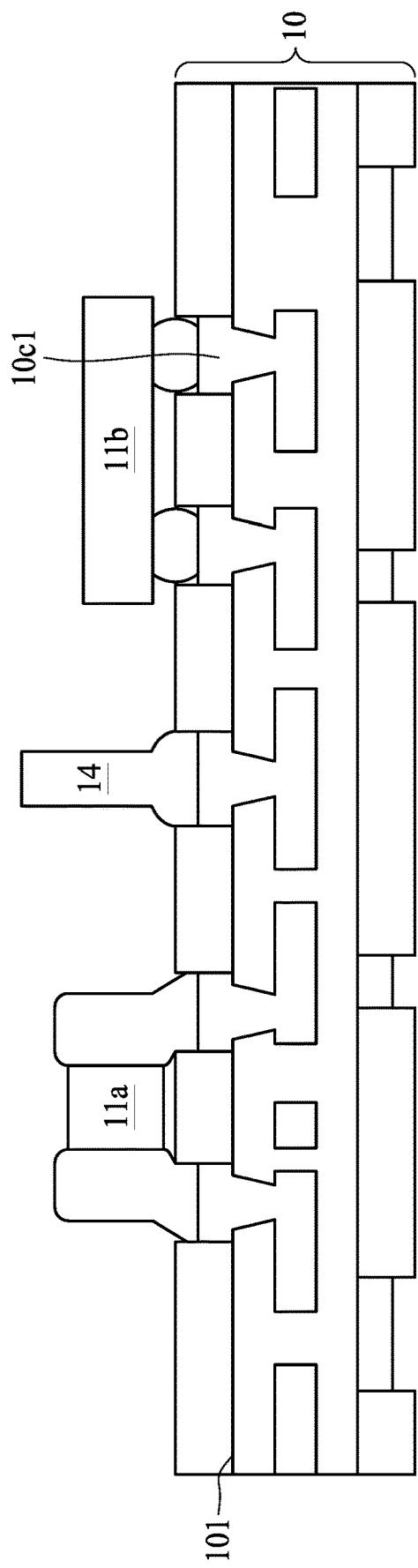
FIG. 3A, FIG. 3A', FIG. 3A", FIG. 3A'''.

FIG. 3A, FIG. 3A', FIG. 3A'', FIG. 3A''', FIG. 3B, FIG. 3C, FIG. 3D, FIG. 3E, FIG. 3F and FIG. 3G illustrate a semiconductor manufacturing method, in accordance with some embodiments of the present disclosure. In some embodiments, the method in FIG. 3A, FIG. 3A', FIG. 3A'', FIG. 3A''', FIG. 3B, FIG. 3C, FIG. 3D, FIG. 3E, FIG. 3F and FIG. 3G can be used to manufacture the semiconductor device package 2 in FIG. 2.

Referring to FIG. 3A, a substrate 10 is provided. For the purpose of clarity, FIG. 3A merely illustrates a unit of substrate (e.g., a single substrate). However, the substrate 10 can be in a wafer type, a panel type or a strip type. Electronic components 11a and 11b are disposed on a surface 101 of the substrate 10. The electronic components 11a and 11b may be placed on the surface 101 of the substrate 10 by, for example, surface mount technology (SMT) or any other suitable operations. The electronic components 11a and 11b may be electrically connected to the conductive pads 10c1 on the surface 101 of the substrate 10 by, for example, flip-chip, wire-bond or any other suitable techniques.

A conductive element 14 is formed on the surface 101 of the substrate 10 and between the electronic component 11a and the electronic component 11b. In some embodiments, the conductive element 14 may include a shielding wall. In some embodiments, the conductive element 14 may include a plurality of conductive pillars/pins/columns/posts, conductive wall or conductive wires, separated from each other. In some embodiments, the conductive element 14 may be formed by, wire-bond, sputtering or any other suitable technologies.

In some embodiments, as shown in FIG. 3A', the conductive element 14 may be formed by or include one or more conductive wires 30w (e.g., bonding wires), each including a first terminal connected to the conductive pad 10c1 of the substrate 10 and a second terminal being a free end.

In some embodiments, as shown in FIG. 3A'', the conductive element 14 may be formed by or include one or more loop wires 30w', each including a first terminal connected to a portion of the conductive pad 10c1 of the substrate 10, and a second terminal connected to another portion of the conductive pad 10c1 (or another conductive pad) of the substrate 10. Each loop wire 30w' may further include a loop portion connecting the first terminal to the second terminal. The loop portion is spaced apart from the substrate 10.

In some embodiments, as shown in FIG. 3A''', the loop wires 30w' may be arranged in two or more rows. In some embodiments, the loop wire 30w' located at the first row and the loop wire 30w' located at the second row may be at least partially overlapping.

Figure 3B:
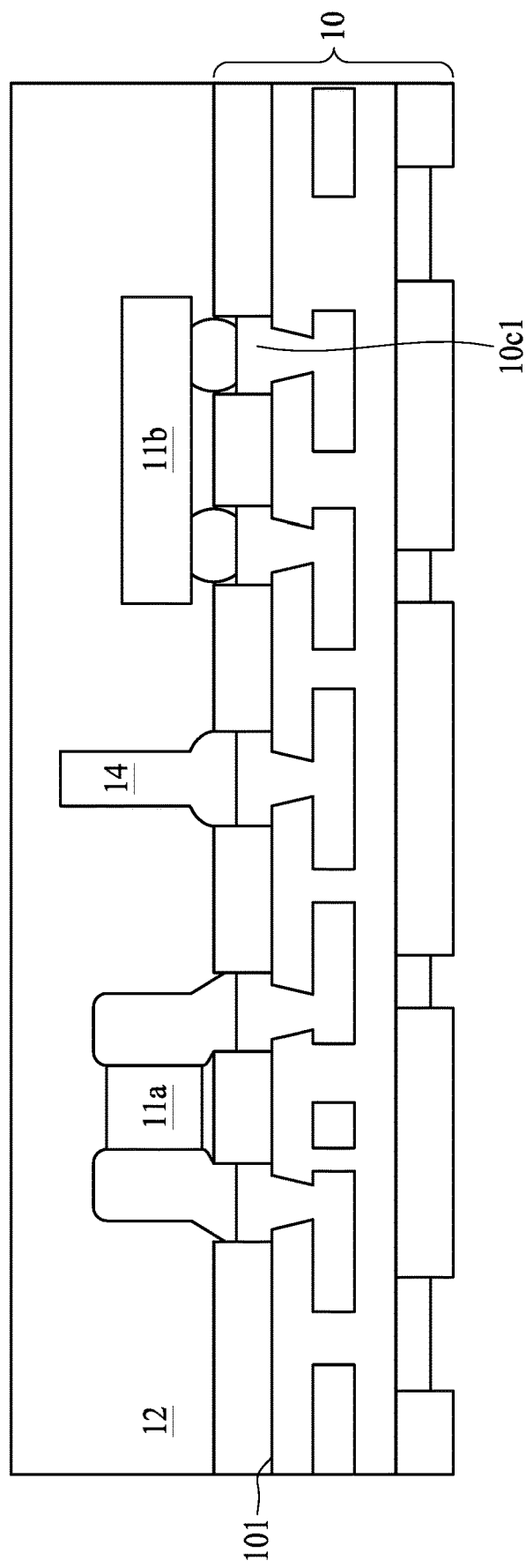
FIG. 3B, FIG. 3C, FIG. 3D, FIG. 3E, FIG. 3F and FIG. 3G illustrate a semiconductor manufacturing method, in accordance with some embodiments of the present disclosure.

Referring to FIG. 3B, a package body 12 is formed on the surface 101 of the substrate 10 to cover the electronic components 11a, 11b and the conductive element 14. In some embodiments, the package body 12 may fully cover the electronic components 11a, 11b and the conductive element 14. In some embodiments, the package body 12 may be formed by, for example, compression molding, transfer molding or any other suitable molding operations.

Figure 3C:
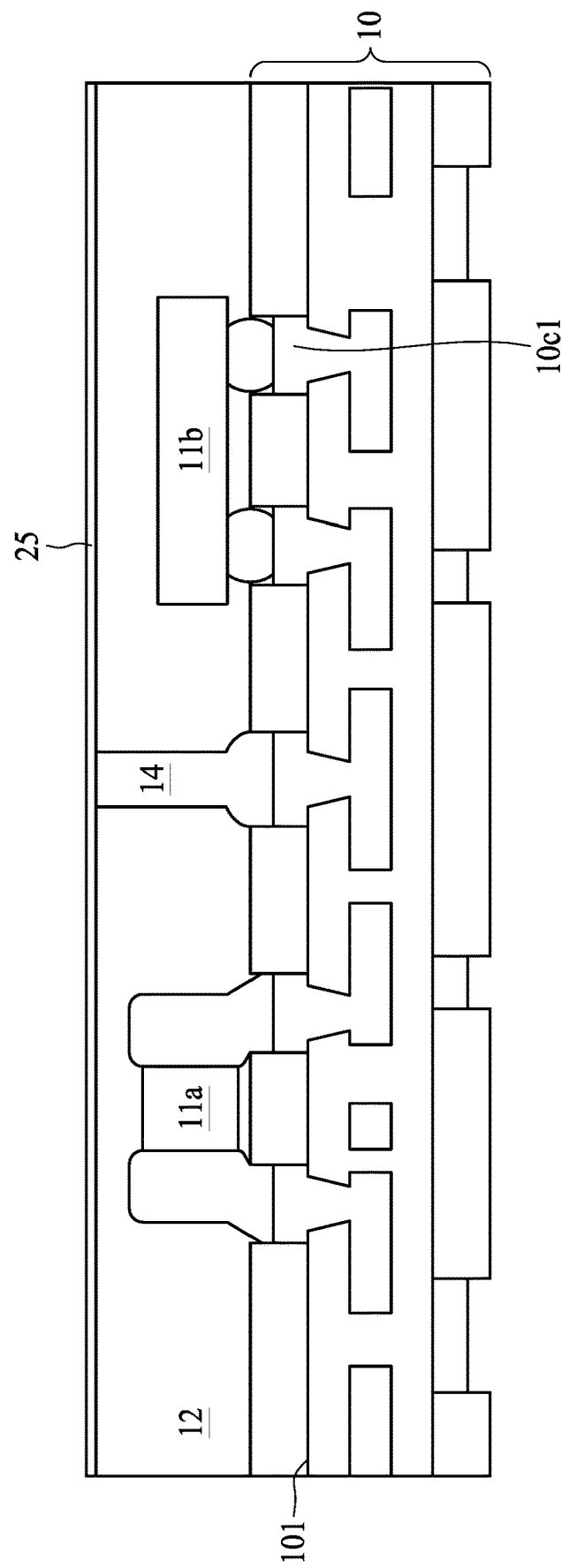

Referring to FIG. 3C, a portion of the package body 12 is removed to expose a top surface of the conductive element 14. In some embodiments, the portion of the package body 12 may be removed by, for example, grinding or any other suitable operations. In some embodiments, a portion of the conductive element 14 may be removed as well. For example, a top portion of each of the loop wires 30w' as shown FIGS. 3A'' and 3A''' would be removed to divide each of the loop wires 30w' into two separate wires.

A protection layer 25 is then formed on the top surface of the package body 12 and the top surface of the conductive element 14. The protection layer 25 is in contact with the top surface of the package body 12 and the top surface of the conductive element 14. In some embodiments, the protection layer 25 may be or include an anti-oxidation protective layer to prevent the top surface of the conductive element 14 from being oxidized during the subsequent operations. In some embodiments, the protection layer 25 may be or include stainless steel. In some embodiments, the protection layer 25 may be formed by, for example, sputtering or any other suitable operations.

In some embodiments, after the grinding operation for removing the portion of the package body 12, the remaining top surface of the package body 12 may have a relatively higher roughness (e.g., about 1.7 micrometers). Hence, to ensure that the protection layer 25 can fully and evenly cover the top surface of the package body 12, the protection layer 25 may have a thickness equal to or greater than 0.1 micrometer.

Figure 3D:
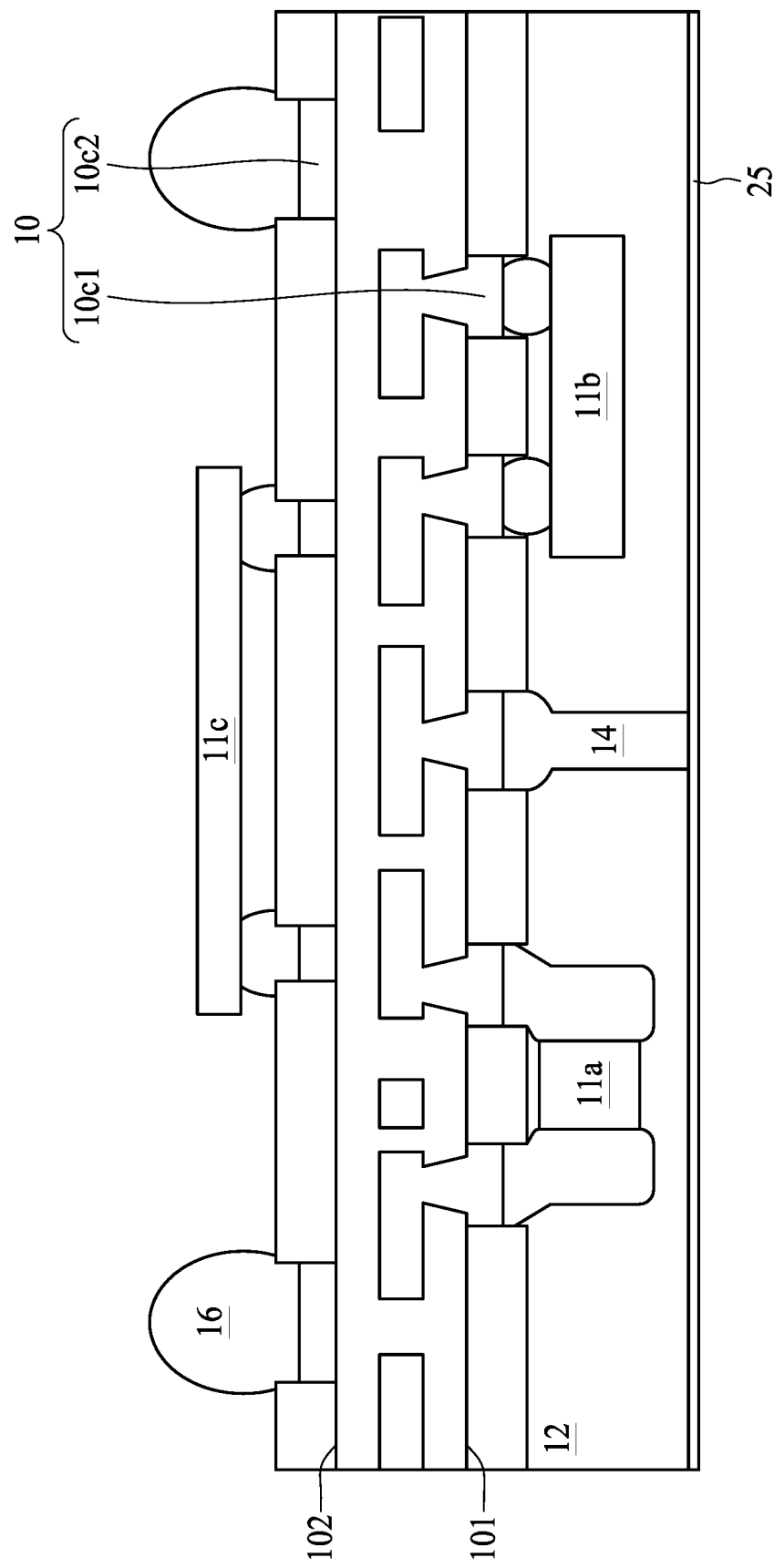

Referring to FIG. 3D, an electronic components 11c is disposed on a surface 102 of the substrate 10. The electronic component 11c may be placed on the surface 102 of the substrate 10 by, for example, SMT or any other suitable operations. The electronic component 11c may be electrically connected to the conductive pads 10c2 on the surface 102 of the substrate 10 by, for example, flip-chip, wire-bond or any other suitable techniques. Electrical contacts 16 are formed on the surface 102 of the substrate 10 and electrically connected to the conductive pads 10c2 on the surface 102 of the substrate 10.

Figure 3E:
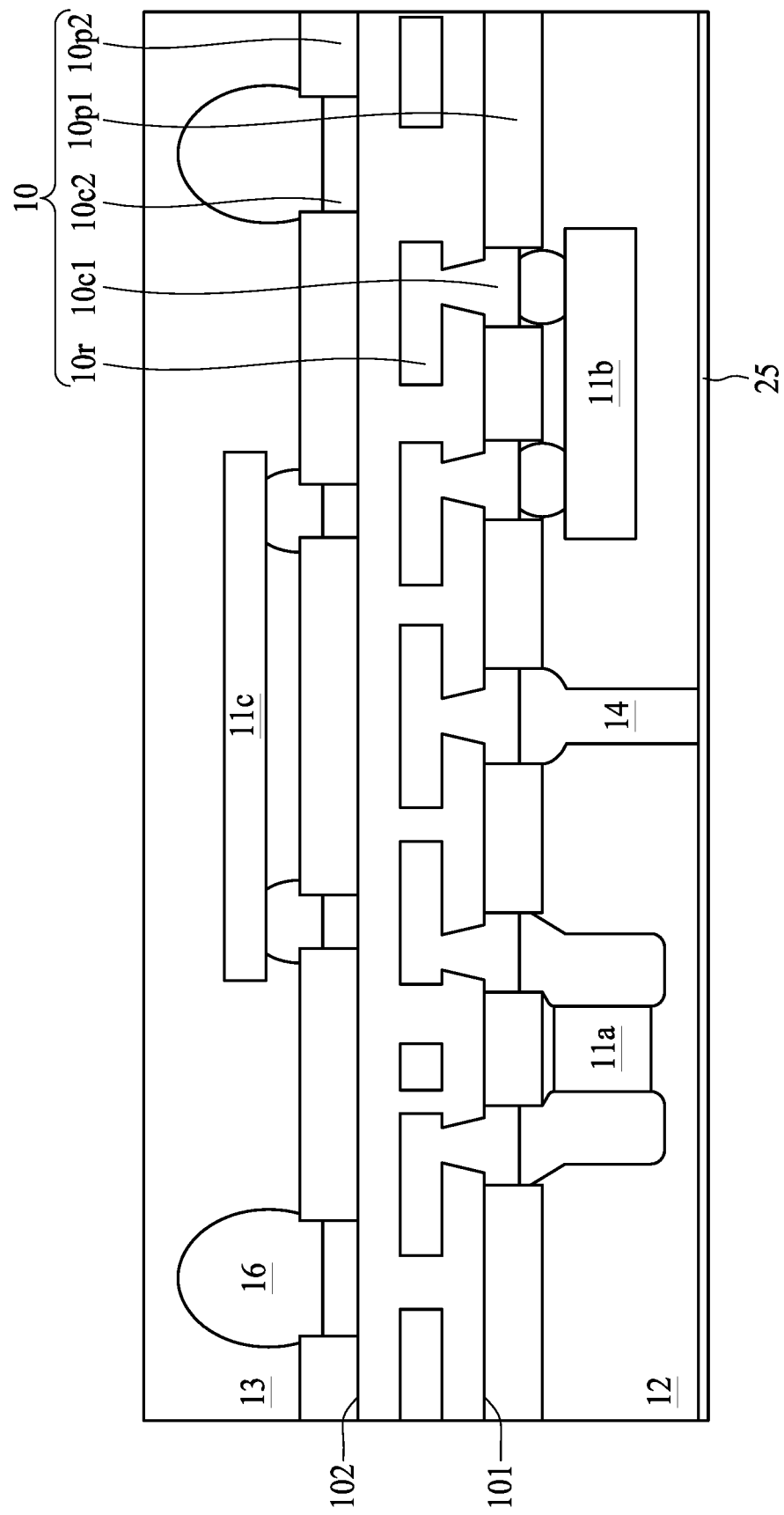

Referring to FIG. 3E, a package body 13 is formed on the surface 102 of the substrate 10 to cover the electronic component 11c and the electrical contacts 16. In some embodiments, the package body 13 may fully cover the electronic component 11c and the electrical contacts 16. In some embodiments, the package body 13 may be formed by, for example, compression molding, transfer molding or any other suitable molding operations.

Figure 3F:
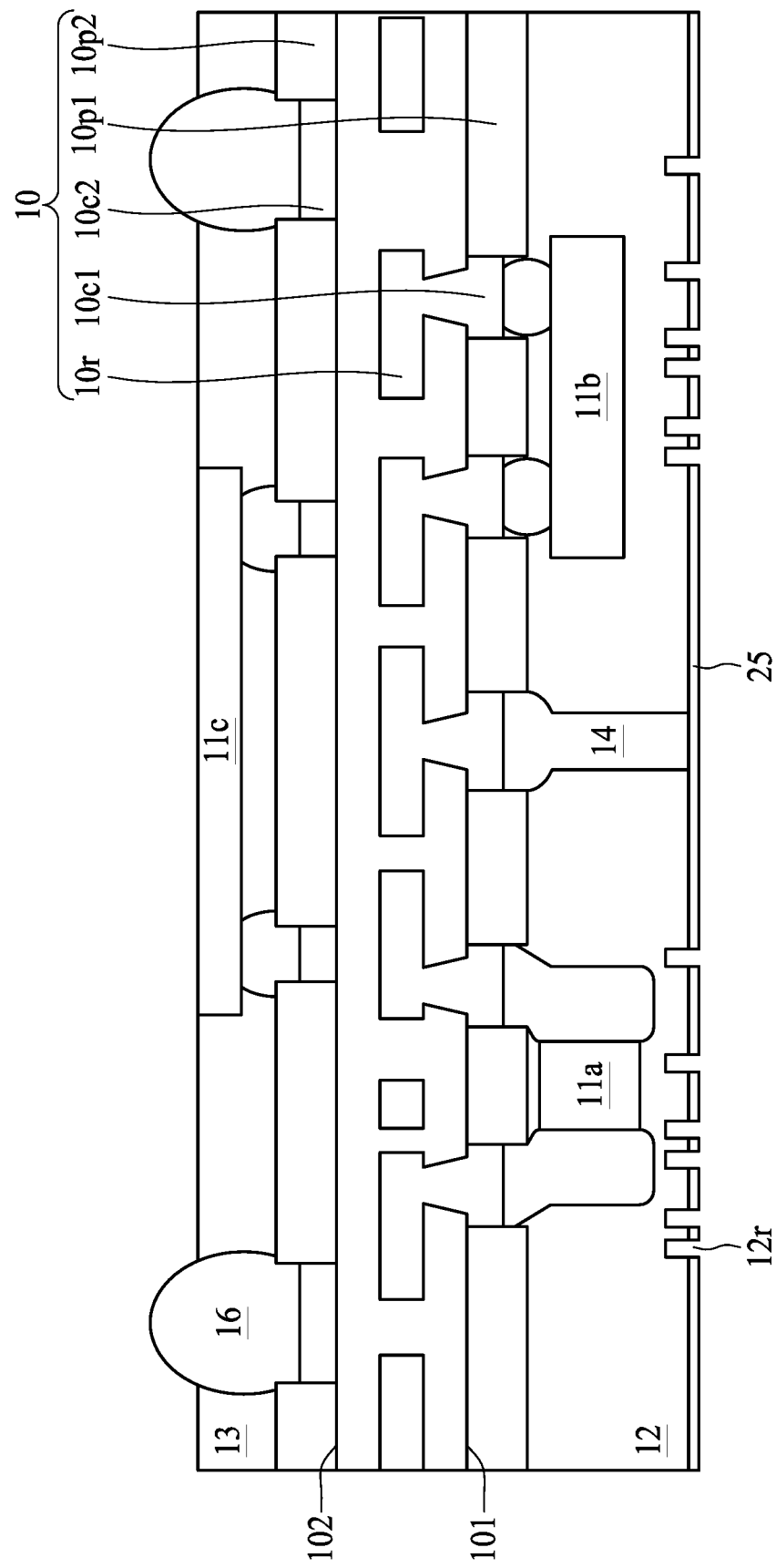

Referring to FIG. 3F, a portion of the package body 13 is removed to expose a portion of the electrical contacts 16 for electrical connections. In some embodiments, the portion of the package body 13 may be removed by, for example, grinding or any other suitable operations. In some embodiments, a backside surface of the electronic component 11c may be exposed from the package body 13. In some embodiments, a reflow operation (or reballing operation) may be carried out to make the electrical contacts 16 protrude from the package body 13 as shown in FIG. 3F.

One or more recesses 12r are then formed to penetrate the protection layer 25 and a portion of the package body 12. The recesses 12 may define a marking 25 as shown in FIG. 2. In some embodiments, the recesses 12r may be formed by, for example, laser, drilling, etching or any other suitable techniques.

Figure 3G:
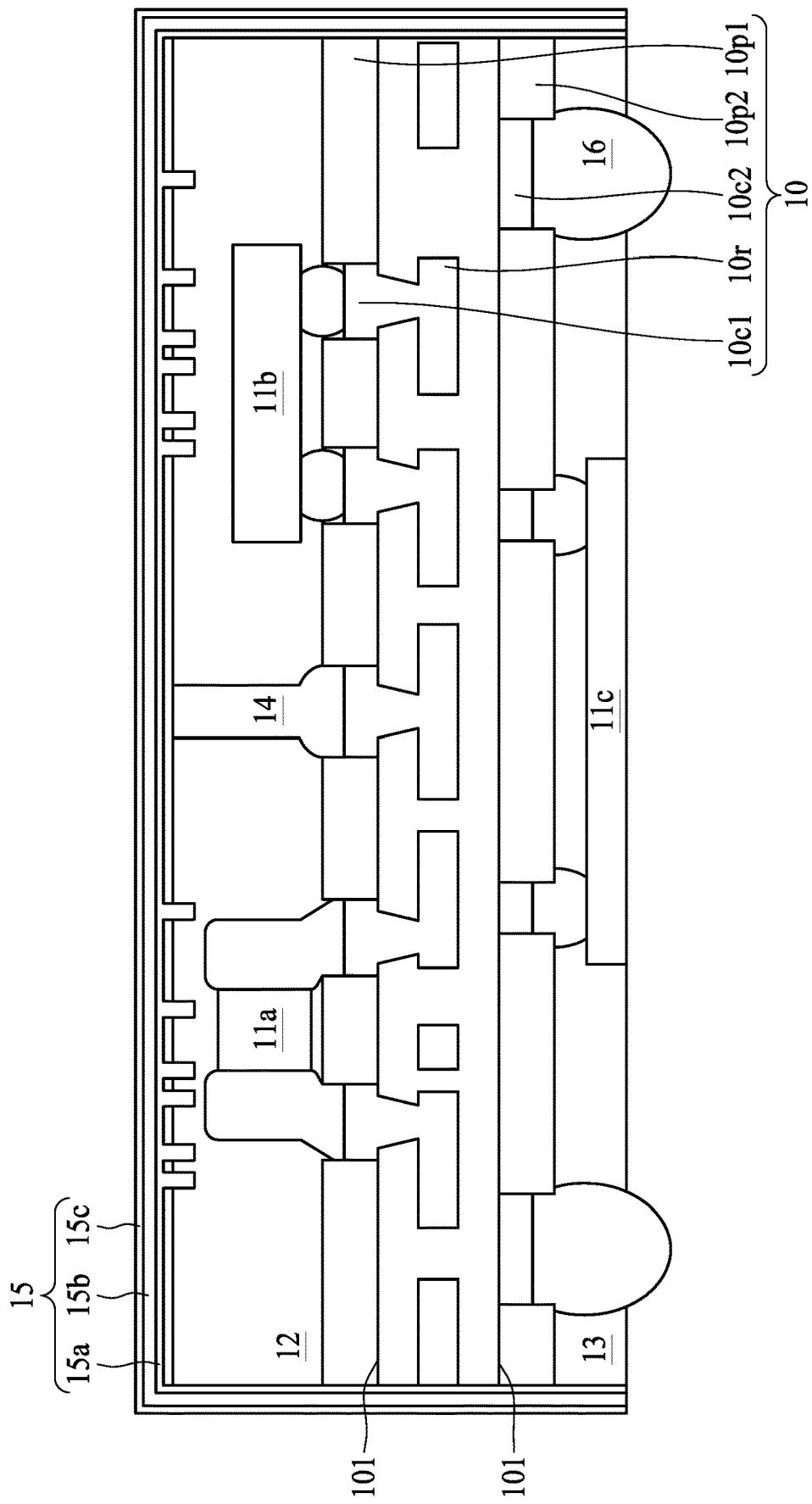

Referring to FIG. 3G, singulation may be performed to separate out individual semiconductor package devices. That is, the singulation is performed through the package body 12, the substrate strip including the substrates 10 and the package body 13. The singulation may be performed, for example, by using a dicing saw, laser or other appropriate cutting technique.

A cover 15 is then formed on external surfaces of the protection layer 25, the package body 12, the substrate 10 and the package body 13 to form the semiconductor device package 2 as shown in FIG. 2. In some embodiments, a conductive layer 15a is formed on the protection layer 25 and within the recesses 12r. The conductive layer 15a is further formed on the lateral surfaces of the package body 12, the substrate 10 and the package body 13. The conductive layer 15b is formed on the conductive layer 15a. The conductive layer 15c is formed on the conductive layer 15b. In some embodiments, the conductive layers 15a and 15c may include stainless steel. In some embodiments, the conductive layer 15b may include Al, Cu, Cr, Sn, Au, Ag, Ni, a mixture or an alloy thereof, or other combination thereof. In some embodiments, the conductive layers 15a, 15b and 15c may be formed by, for example, coating, sputtering, plating, printing or any other suitable operations.

In accordance with the embodiments as shown in FIGS. 3A, 3A', 3A'', 3A''', 3B, 3C, 3D, 3E, 3F and 3G, forming the protection layer 25 to cover the top surface of the conductive element 14 (and the top surface of the package body 12) after the top surface of the conductive element 14 is exposed from the package body 12 can prevent the top surface of the conductive element 14 from being oxidized during the operations for forming the elements on the surface 102 of the substrate 10. This can facilitate the connection between the conductive element 14 and the cover 15 and reduce the resistance between the cover 15 and the conductive element 14, so as to enhance the shielding performance of the conductive element 14 and the cover 15.

Figure 4A:
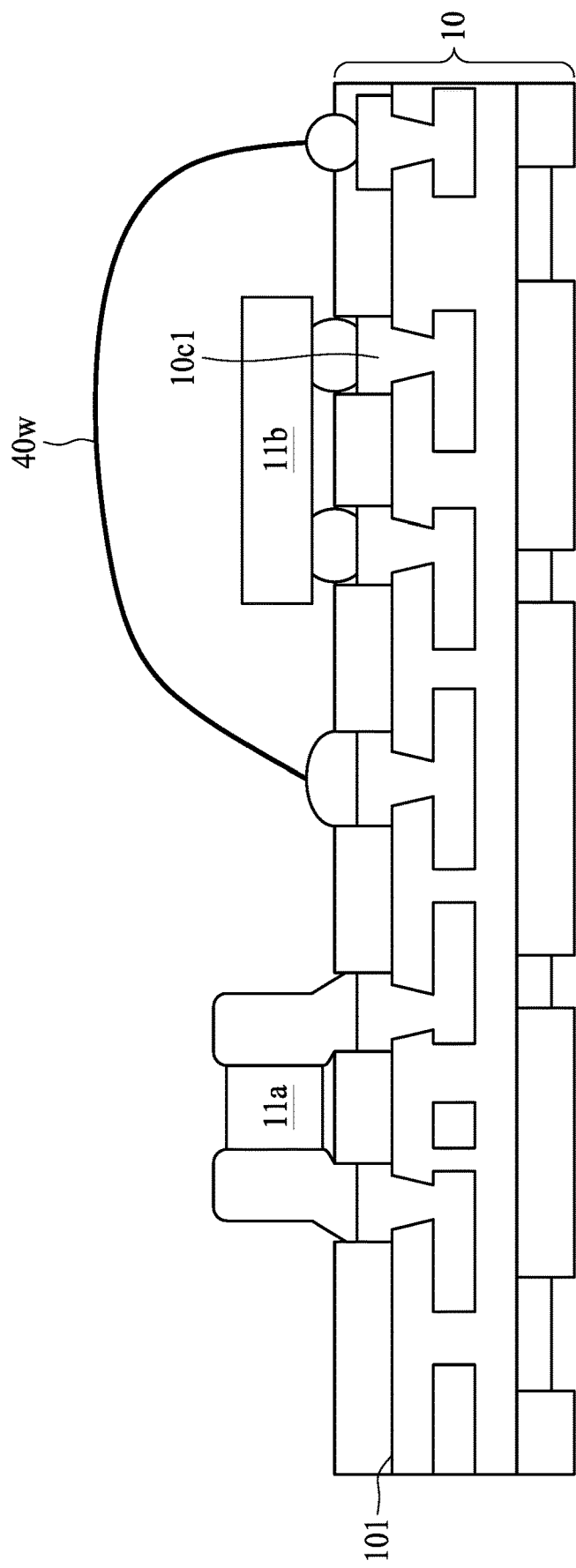
FIG. 4A, FIG. 4A' and FIG. 4B illustrate a semiconductor manufacturing method, in accordance with some embodiments of the present disclosure.
Figure 4A:
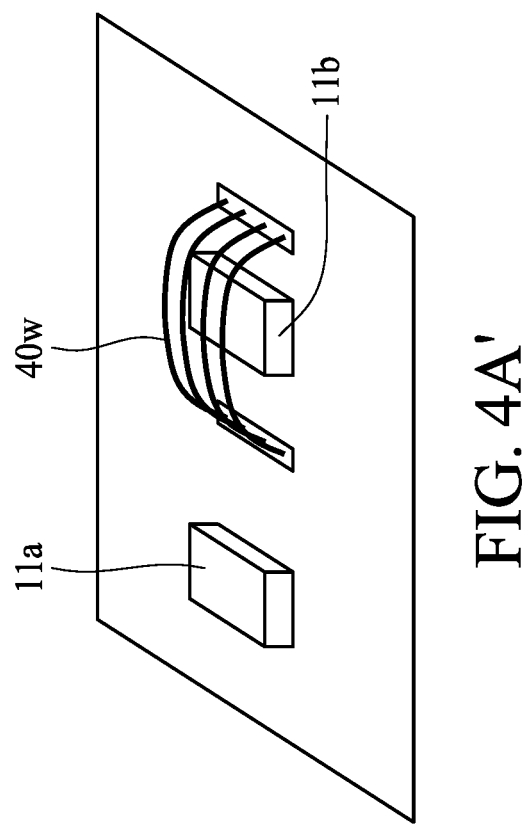

FIGS. 4A, 4A' and 4B illustrate a semiconductor manufacturing method, in accordance with some embodiments of the present disclosure. In some embodiments, the operations in FIGS. 4A, 4A' and 4B are similar to those as shown in FIG. 3A, FIG. 3A', FIG. 3A'', FIG. 3A''', FIG. 3B, FIG. 3C, FIG. 3D, FIG. 3E, FIG. 3F and FIG. 3G, and some of the differences therebetween are described below.

Referring to FIG. 4A and FIG. 4A', after disposing the electronic components 11a and 11b of the substrate 10, a loop wire 40w is formed to across the electronic component 11b. For example, one terminal of the loop wire 40w is connected to a conductive pad adjacent to one side of the electronic component 11b, and the other terminal of the loop wire 40w is connected to another conductive pad adjacent to an opposite side of the electronic component 11b. The loop wire 40w may further include a loop portion across the electronic component 11b and connecting both terminals of the loop wire 40w.

Figure 4B:
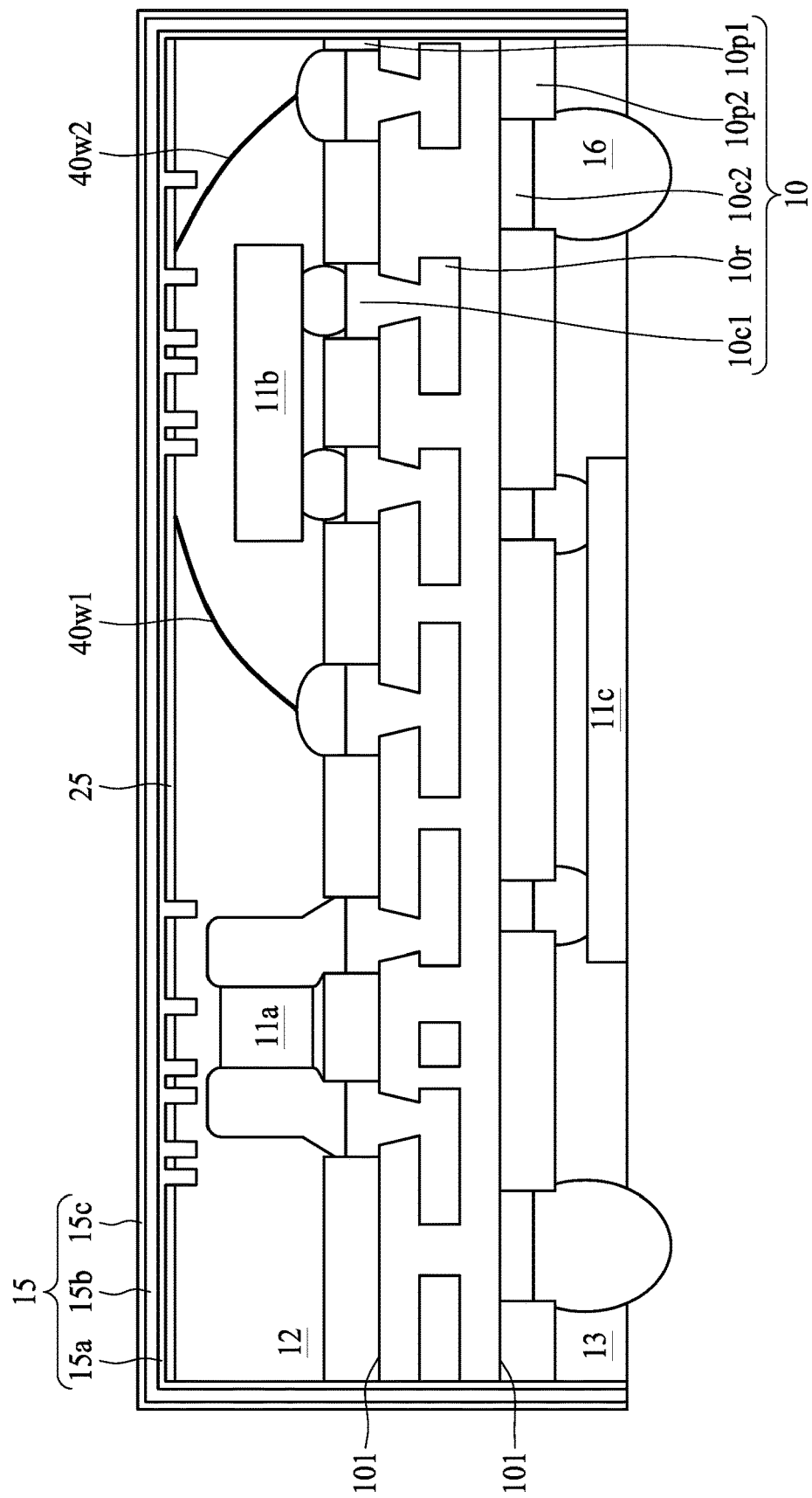

After the operations similar to the operations as shown in FIGS. 3B, 3C, 3D, 3E, 3F and 3G, a semiconductor device package 4 is formed as shown in FIG. 4B. In some embodiments, after the operation for removing a portion of the package body 12 as shown in FIG. 3C, the loop wire 40w may be divided into two portions 40w1 and 40w2 as shown in FIG. 4B, each having a top terminal exposed from the package body 12 and in contact with the protection layer 25. For example, a top portion of the loop wire 40w may be fully removed to divide the loop wire 40 into two separate portions 40w1 and 40w2. In other embodiments, only a portion of the top portion of the loop wire 40w is removed to be exposed from the package body 12 without cutting the loop wire 40w into two separate portions 40w1 and 40w2.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" the same if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, "substantially" parallel can refer to a range of angular variation relative to 0° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°. For example, "substantially" perpendicular can refer to a range of angular variation relative to 90° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°.

Two surfaces can be deemed to be coplanar or substantially coplanar if a displacement between the two surfaces is no greater than 5 µm, no greater than 2 µm, no greater than 1 µm, or no greater than 0.5 µm.

Additionally, amounts, ratios, and other numerical values are sometimes presented herein in a range format. It can be understood that such range formats are used for convenience and brevity, and should be understood flexibly to include not only numerical values explicitly specified as limits of a range, but also all individual numerical values or sub-ranges encompassed within that range as if each numerical value and sub-range is explicitly specified.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately $10^4$ S/m, such as at least $10^5$ S/m or at least $10^6$ S/m. The electrical conductivity of a material can sometimes vary with temperature. Unless otherwise specified, the electrical conductivity of a material is measured at room temperature.

As used herein, the singular terms "a," "an," and "the" may include plural referents unless the context clearly dictates otherwise. In the description of some embodiments, a component provided "on" or "over" another component can encompass cases where the former component is directly on (e.g., in physical contact with) the latter component, as well as cases where one or more intervening components are located between the former component and the latter component.

While the present disclosure has been described and illustrated with reference to specific embodiments thereof, these descriptions and illustrations do not limit the present disclosure. It can be clearly understood by those skilled in the art that various changes may be made, and equivalent components may be substituted within the embodiments without departing from the true spirit and scope of the present disclosure as defined by the appended claims. The illustrations may not necessarily be drawn to scale. There may be distinctions between the artistic renditions in the present disclosure and the actual apparatus, due to variables in manufacturing processes and such. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it can be understood that these operations may be combined, sub-divided, or re-ordered to form an equivalent method without departing from the teachings of the present disclosure. Therefore, unless specifically indicated herein, the order and grouping of the operations are not limitations of the present disclosure.

What is claimed is:

1. A semiconductor device package, comprising
a substrate having a first surface, a second surface opposite to the first surface and a lateral surface extending between the first surface and the second surface;
a conductive element disposed on the first surface of the substrate;
a first package body disposed over the first surface of the substrate,
an anti-oxidation protective layer in contact with a top surface of the first package body and the conductive element, wherein the anti-oxidation protection layer has a plurality of openings; and
a first conductive layer in contact with a lateral surface of the first package body, wherein the first conductive layer comprises a plurality of protrusions filled in the plurality of openings of the anti-oxidation protection layer.

2. The semiconductor device package of claim 1, wherein the first conductive layer is a seed layer and disposed on the anti-oxidation protective layer and on the lateral surface of the substrate, the anti-oxidation protective layer and the first conductive layer define an interface, and the first conductive layer is spaced apart from the conductive element by the anti-oxidation protective layer.

3. The semiconductor device package of claim 1, wherein the first conductive layer is in contact with a top surface and a lateral surface of the anti-oxidation protective layer.

4. The semiconductor device package of claim 1, further comprising:
a first electronic component disposed on the first surface of the substrate; and
a second electronic component disposed on the first surface of the substrate and separated from the first electronic component by the conductive element.

5. The semiconductor device package of claim 4, wherein the first package body covers the first electronic component, the second electronic component and a portion of the conductive element, and a top surface of the conductive element is exposed from the first package body to contact the anti-oxidation protective layer.

6. The semiconductor device package of claim 5, wherein a lateral surface of the anti-oxidation protective layer is substantially coplanar with the lateral surface of the first package body.

7. The semiconductor device package of claim 4, further comprising:
a third electronic component disposed on the second surface of the substrate; and
a second package body disposed on the second surface of the substrate and at least partially covering the third electronic component.

8. The semiconductor device package of claim 4, wherein the conductive element is adjacent to at least two lateral surfaces of the first electronic component and the second electronic component.

9. The semiconductor device package of claim 1, wherein the plurality of protrusions of the first conductive layer extend into a plurality of recesses of the first package body.

10. A semiconductor device package, comprising
a substrate having a first surface, a second surface opposite to the first surface and a lateral surface extending between the first surface and the second surface;
a conductive element disposed on the first surface of the substrate;

conductive layers disposed on the conductive element and the lateral surface of the substrate, the conductive layers comprising an anti-oxidation protective layer disposed on the conductive element and spaced apart from the lateral surface of the substrate, wherein the anti-oxidation protection layer has a plurality of openings; and a first package body disposed over the first surface of the substrate, wherein the conductive layers further comprise a first conductive layer in contact with a lateral surface of the first package body, and the anti-oxidation protective layer is in contact with a top surface of the first package body and the conductive element, wherein a resistance between the second surface of the substrate and the conductive layers is in a range from 0.0080 hm to 0.080 hm, and wherein the first conductive layer comprises a plurality of protrusions filled in the plurality of openings of the anti-oxidation protection layer.

11. The semiconductor device package of claim 10, wherein the first conductive layer is disposed on the anti-oxidation protective layer and on the lateral surface of the substrate, and the anti-oxidation protective layer and the first conductive layer define an interface.

12. The semiconductor device package of claim 11, wherein the first package body covers a portion of the conductive element, and a top surface of the conductive element is exposed from the first package body to contact with the anti-oxidation protective layer.

13. The semiconductor device package of claim 12, wherein the first conductive layer comprises a portion penetrating through the anti-oxidation protective layer and extending within a recess of the first package body.

14. The semiconductor device package of claim 10, wherein the resistance between the second surface of the substrate and the conductive layers is equal to or smaller than 0.068 Ohm.

15. The semiconductor device package of claim 14, wherein the resistance between the second surface of the substrate and the conductive layers is equal to or greater than about 0.021 Ohm.

16. The semiconductor device package of claim 10, further comprising:
 a first electronic component disposed on the first surface of the substrate;
 a second electronic component disposed on the first surface of the substrate and separated from the first electronic component by the conductive element;
 a third electronic component disposed on the second surface of the substrate; and
 a second package body disposed on the second surface of the substrate and at least partially covering the third electronic component.

17. A method of manufacturing a semiconductor device package, comprising:
 (a) forming a conductive element on a first surface of a substrate;
 (b) forming an anti-oxidation protective layer in contact with a top surface of the conductive element, wherein the anti-oxidation protection layer has a plurality of openings;
 (c) forming a first electronic component on a second surface of the substrate opposite to the first surface of the substrate; and
 (d) forming a conductive layer on the anti-oxidation protective layer, and
wherein the conductive layer comprises a plurality of protrusions filled in the plurality of openings of the anti-oxidation protection layer.

18. The method of claim 17, further comprising: prior to operation (b), forming a first package body to cover a portion of the conductive element and to expose the top surface of the conductive element.

* * * * *